(12) United States Patent
Doyle et al.

(10) Patent No.: US 8,542,068 B2
(45) Date of Patent: Sep. 24, 2013

(54) OSCILLATOR WITH HIGHLY-ADJUSTABLE BANG-BANG CONTROL

(75) Inventors: Bruce A. Doyle, Longmont, CO (US); Emerson S. Fang, Fremont, CA (US); Alvin L. Loke, Fort Collins, CO (US); Shawn Searles, Austin, TX (US); Stephen F. Greenwood, Fort Collins, CO (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 28 days.

(21) Appl. No.: 13/332,990

(22) Filed: Dec. 21, 2011

(65) Prior Publication Data
US 2013/0162357 A1 Jun. 27, 2013

(51) Int. Cl.
*H03L 7/00* (2006.01)

(52) U.S. Cl.
USPC .............................................. 331/17; 331/57

(58) Field of Classification Search
USPC ........................................................ 331/17, 57
See application file for complete search history.

(56) References Cited

U.S. PATENT DOCUMENTS

| 5,399,995 | A | * | 3/1995 | Kardontchik et al. | .......... 331/17 |
| 5,952,892 | A | * | 9/1999 | Szajda | ............................. 331/57 |

\* cited by examiner

*Primary Examiner* — Joseph Chang
(74) *Attorney, Agent, or Firm* — Harrity & Harrity, LLP

(57) ABSTRACT

A device may include an oscillator to generate a clock signal based on first and second control signals. The oscillator may include a first buffer stage a second buffer stage. The first buffer stage may output a first signal that is based on an output of the second buffer stage and the first control signal. The second buffer stage may output the clock signal. The clock signal may be based on the first signal and the second control signal.

20 Claims, 9 Drawing Sheets

OSCILLATOR WITH HIGHLY-ADJUSTABLE BANG-BANG CONTROL

BACKGROUND

Phase-locked loops ("PLLs") are commonly used to support the generation of sampling clocks for data recovery in high speed data transmission systems. "Bang-bang" PLLs are often utilized due to a nature of responses to the bang-bang PLLs' dual path architecture. Bang-bang PLLs may utilize two paths—an integral path and a proportional path. The integral path is generally a low-bandwidth path that is used to track the frequency of an incoming data stream. The proportional path is generally a high-bandwidth path (e.g., a higher bandwidth than the integral control path) that is used to track an optimum instantaneous sampling position of the incoming data stream. The integral and/or proportional control paths may be used to control an oscillator, such as a voltage-controlled oscillator ("VCO") of a bang-bang PLL.

A device, such as an analog and/or digital receiver, may receive an input data stream. Due to various factors (e.g., line noise, lossiness, etc.), the phase of the input data stream may vary unpredictably. This phenomenon may be referred to as jitter. A PLL may be used to align a data sampling clock to the input data stream to assist in accounting for jitter in the data stream.

SUMMARY OF EMBODIMENTS OF THE INVENTION

According to one or more embodiments, a device may include an oscillator to generate a clock signal based on first and second control signals. The oscillator may include a first buffer stage a second buffer stage. The first buffer stage may output a first signal that is based on an output of the second buffer stage and the first control signal. The second buffer stage may output the clock signal. The clock signal may be based on the first signal and the second control signal.

According to one or more other embodiments, a system may include one or more detector components to generate first and second control signals based on data edges of a data stream. The system may also include a clock generation component to generate a clock signal based on the first and second control signals. The clock generation component may include a first buffer stage and a second buffer stage. The first buffer stage may output a first signal that is based on an output of the second buffer stage and the first control signal, and where the second buffer may output the clock signal, where the clock signal is based on the first signal and the second control signal.

According to one or more other embodiments, a method may include outputting, by a first buffer stage of an oscillator device, a first signal that is based on an output of a second buffer stage of the oscillator device and a first control signal. The method may further include receiving, by the second buffer stage, the first signal. The method may also include outputting, by the second buffer stage, a clock signal that is based on the first signal and a second control signal that is different from the first control signal.

BRIEF DESCRIPTION OF THE DRAWINGS

The accompanying drawings, which are incorporated in and constitute a part of this specification, illustrate one or more embodiments described herein and, together with the description, explain these embodiments. In the drawings.

DETAILED DESCRIPTION

The following detailed description refers to the accompanying drawings. The same reference numbers in different drawings may identify the same or similar elements.

Figure 1:
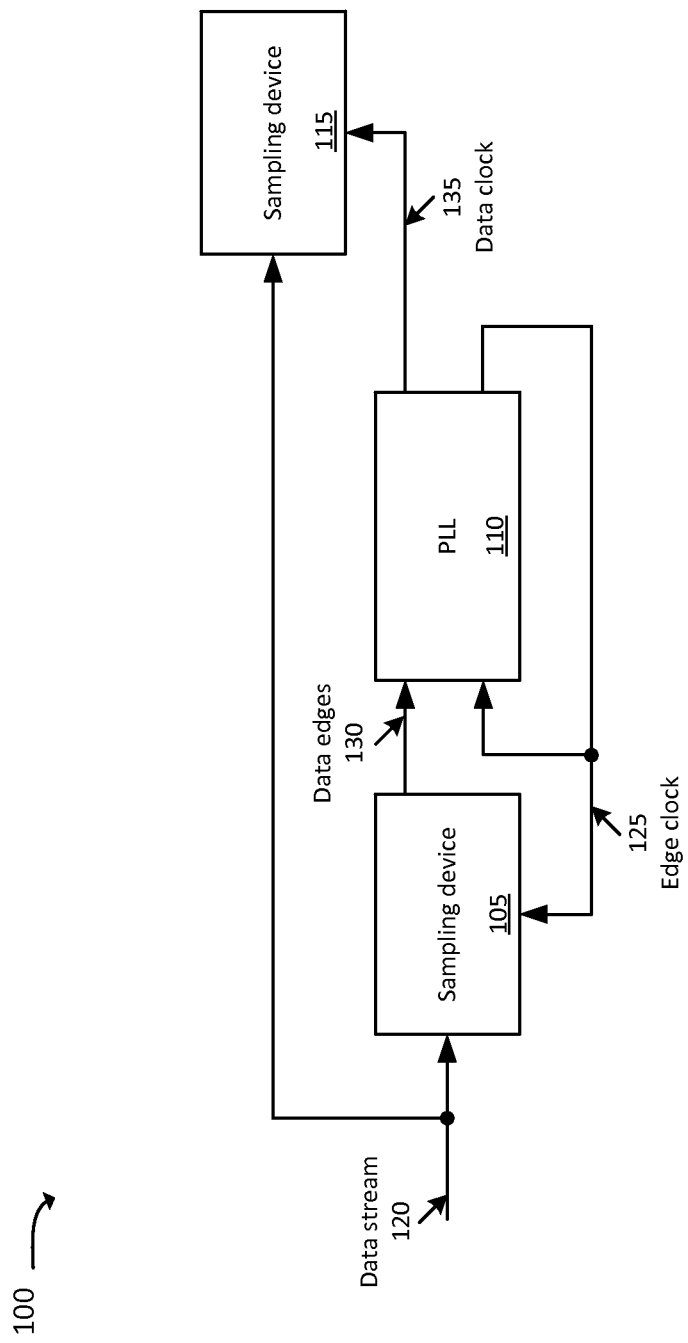
FIG. 1 is a diagram of an example system for adjusting a data clock based on an incoming data stream clock.

Systems and/or methods described herein may enable an oscillator of a phase-locked loop ("PLL") to generate one or more clock signals based on control signals provided to individual buffer stages within an oscillator associated with the PLL. FIG. 1 is a diagram of an example system 100 for generating a data clock based on an incoming data stream. System 100 may include a sampling device 105, a PLL 110, and a sampling device 115. In other implementations, system 100 may include fewer components, additional components, differently arranged components, or different components.

Sampling device 105 may include one or more devices that receive a data signal (e.g., a data stream 120) and, based on a clock signal (e.g., an edge clock signal 125), output information indicating when one or more bits of data occurs (e.g., data edges 130) in the data signal.

PLL 110 may include one or more devices that receive a reference input (e.g., data edges 130) and output one or more clock signals (e.g., edge clock signal 125 and a data clock signal 135) that is based on the reference input. The output signals (e.g., edge clock signal 125 and data clock signal 135) may have a particular phase relationship with respect to data edges 130. For example, edge clock signal 125 may have the same phase as data edges 130 (e.g., rising edges of edge clock signal 125 may occur simultaneously with rising edges of data edges 130, falling edges of edge clock signal 125 may occur simultaneously with falling edges of data edges 130, etc.).

Data clock signal 135 may have a different phase relationship with edge clock signal 125 than the phase relationship data clock signal 135 has with data edges 130. For example, the phase of edge clock signal 125 may be the opposite of the phase of data edges 130. In other words, for example, rising edges of edge clock signal 125 may occur simultaneously with falling edges of data clock signal 135, falling edges of edge clock signal 125 may occur simultaneously with rising edges of data clock signal 135, etc. Furthermore, two or more of edge clock signal 125, data edges 130, and data clock signal 135 may have the same frequency as each other.

Sampling device 115 may include one or more devices that receive data stream 120, and sample data included in data stream 120, based on data clock signal 135. In other words, sampling device 115 may use data clock signal 135 to indicate when sampling device 115 should sample data stream 120.

Figure 2A:
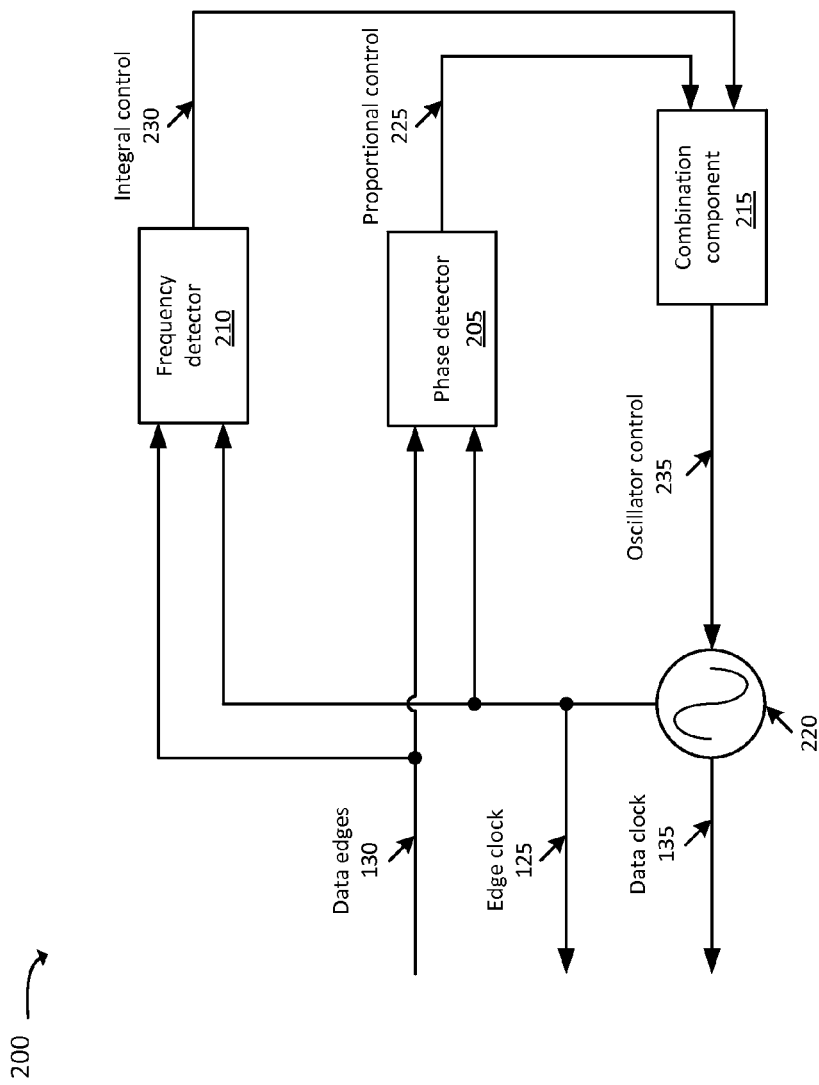
FIG. 2A is a diagram of example components of a phase-locked loop for generating a data clock and an edge clock.

FIG. 2A is a diagram of example components of a PLL 200 for generating a data clock and an edge clock. In one implementation, example PLL 200, illustrated in FIG. 2A, may correspond to PLL 110, shown in FIG. 1. PLL 200 may include a phase detector 205, a frequency detector 210, combination component 215, and an oscillator 220. In other implementations, PLL 200 may include fewer components, additional components, differently arranged components, or different components.

Phase detector 205 may include one or more devices that receive signals, detect a phase difference between the signals, and output a control signal based on the phase difference. As shown in FIG. 2A, phase detector 205 may receive edge clock signal 125 and data edges 130. Phase detector 205 may detect a phase difference between edge clock signal 125 and data edges 130, and output a control signal (e.g., a proportional control signal 225), based on the detected phase difference.

Frequency detector 210 may include one or more devices that receive signals, detect a frequency difference between the signals, and output a control signal based on the frequency difference. As shown in FIG. 2A, frequency detector 210 may receive edge clock signal 125 and data edges 130. Frequency detector 210 may detect a frequency difference between edge clock signal 125 and data stream 130, and output a control signal (e.g., an integral control signal 230), based on the detected frequency difference.

Phase detector 205 may detect differences in the phases of edge clock 125 and data edges 130 more frequently than frequency detector 210 detects differences in the frequencies of edge clock 125 and data edges 130. Thus, proportional control signal 225 may change more frequently than integral control signal 230 changes. Furthermore, a difference between the largest value and the smallest value represented by proportional control signal 225 over the period of time may be smaller than a difference between the largest value and the smallest value represented by integral control signal 230 over the period of time.

Combination component 215 may receive proportional control signal 225 and integral control signal 230, and generate an oscillator control signal 235 that is based on proportional control signal 225 and integral control signal 230. For example, proportional control signal 225 may represent a value of x, while integral control signal 230 may represent a value of y. In one implementation, oscillator control signal 235 may represent a value of (x+y). In other implementations, oscillator control signal 235 may represent a value that is based on any function of x and y.

In one implementation, oscillator control signal 235 may be provided to oscillator 220 as a voltage signal. In such an implementation, combination component 215 may include one or more voltage sources that supply the voltage for oscillator control signal 235. Additionally, or alternatively, the voltage for oscillator control signal 235 may be supplied from another voltage source.

Alternatively, or additionally, oscillator control signal 235 may be provided to oscillator 220 as a current signal. In such an implementation, combination component 215 may include one or more current sources that supply the current for oscillator control signal 235. Additionally, or alternatively, the current for oscillator control signal 235 may be supplied from another current source. By supplying oscillator control signal 235 as a current, surface area that is occupied by circuitry (e.g., voltage supply circuitry) may be reduced.

Figure 2B:
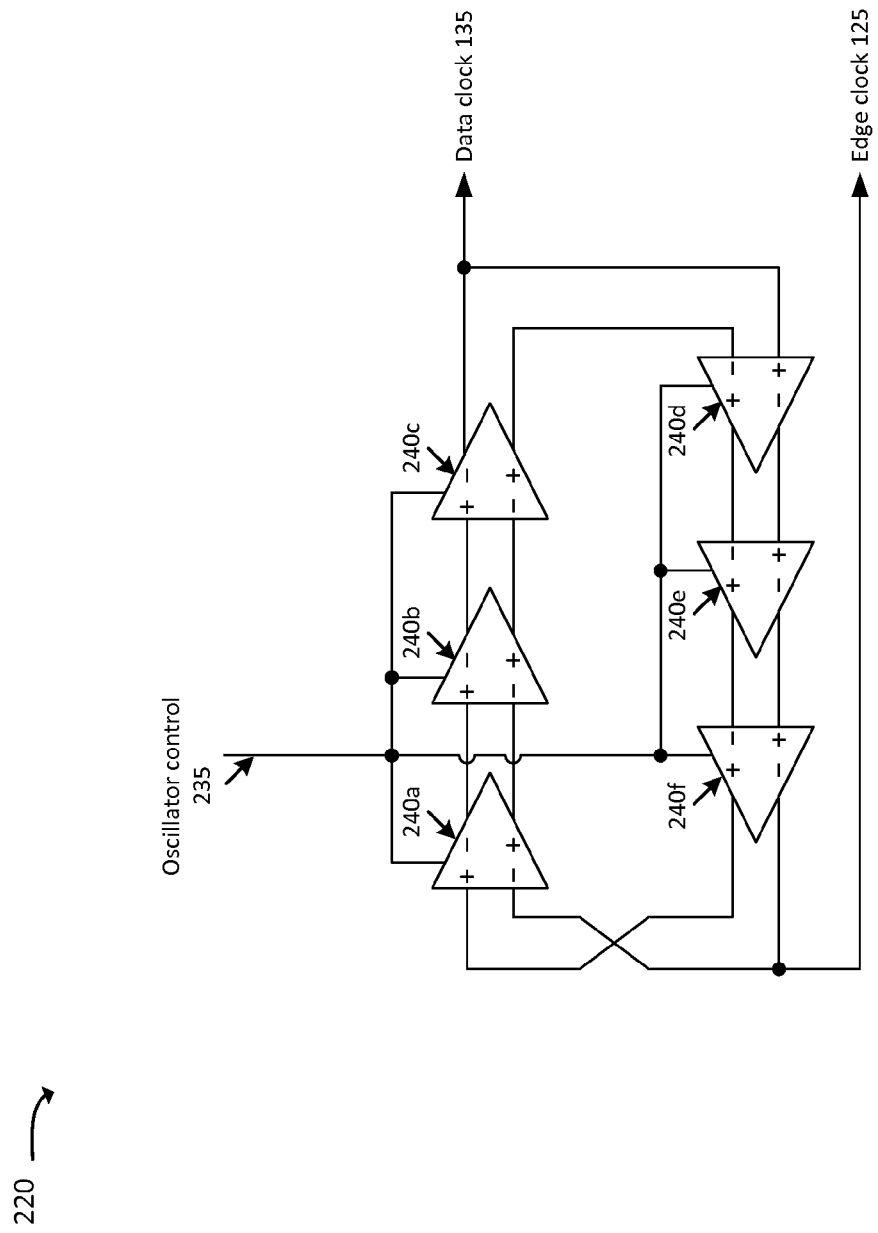
FIG. 2B is a diagram of example components of an oscillator illustrated in FIG. 2A.

Oscillator 220 may receive oscillator control signal 235, and generate edge clock signal 125 and data clock 135 based on oscillator control signal 235. Example components of oscillator 220 are described below with reference to FIG. 2B. As shown in FIG. 2B, oscillator 220 may include a set of buffer stages 240a-f (hereinafter referred to individually as "buffer stage 240," and collectively as "buffer stages 240").

Each buffer stage 240 may include one or more pairs of buffers (e.g., inverters, amplifiers, CML buffers, etc.). Each buffer stage 240 may receive two opposite signals as inputs, and may output two opposite signals as outputs. For example, buffer stage 240a may receive a high-voltage signal (e.g., a logical 1) as a first input, and a low-voltage signal (e.g., a logical 0) as a second input. Buffer stage 240 may output a low-voltage signal (e.g., a logical 0) as a first output, and a high-voltage signal (e.g., a logical 0) as a second output.

A particular output of buffer stage 240c (e.g., an output of one buffer of a pair of buffers in buffer stage 240c) may correspond to data clock signal 135, while a particular output (e.g., an output of one buffer of a pair of buffers in buffer stage 240O of buffer stage 240f may correspond to edge clock signal 125. In the example shown in FIG. 2B, buffer stage 240c may be the third buffer stage out of the six buffer stages 240a-f, while buffer stage 240f may be the sixth buffer stage out of the six buffer stages 240a-f. As such, opposite buffer stages 240 may provide clock signals 125 and 135. In other words, a particular buffer stage 240 may provide one of clock signals 125 and 135, while another buffer stage 240, that is q/2 buffer stages removed from the particular buffer stage 240 (where "q" is the quantity of buffer stages 240 in oscillator 220), may provide the other one of clock signals 125 and 135.

In other implementations, buffer stages 240, which are not opposite buffer stages, may respectively output clock signals 125 and 135. For example, in one other implementation, buffer stage 240c may output data clock signal 135, while buffer stage 240d may output edge clock signal 125.

Each buffer stage 240 may receive oscillator control signal 235. As mentioned above, in one implementation, oscillator control signal 235 may be supplied by a voltage source. Alternatively, or additionally, oscillator control signal 235 may be supplied by a current source. As also mentioned above, oscillator control signal 235 may be based on proportional control signal 225 and integral control signal 230 (e.g., a logical sum of the values represented by control signal 225 and integral control signal 230, or any other function that is based on control signal 225 and integral control signal 230).

Increasing oscillator control signal 235 (e.g., increasing a voltage associated with oscillator control signal 235, increasing a current associated with oscillator control signal 235, etc.) may reduce the delay of transmission of signals from one buffer stage 240 to another, thereby increasing the frequencies of edge clock signal 125 and data clock signal 135.

Figure 3A:
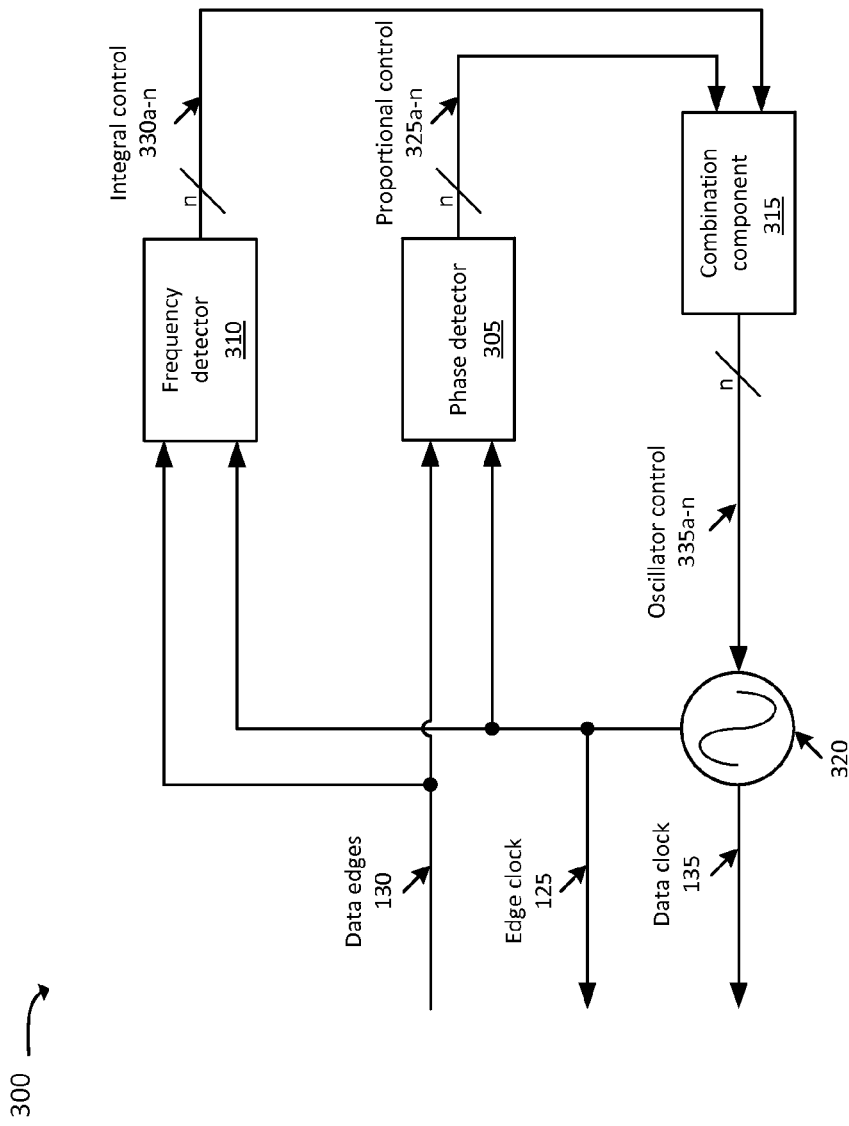
FIG. 3A is a diagram of example components of another phase-locked loop for generating a data clock and an edge clock.

FIG. 3A is a diagram of example components of a PLL 300 for generating a data clock and an edge clock. In one implementation, example PLL 300, illustrated in FIG. 3A, may correspond to PLL 110, shown in FIG. 1. PLL 300 may include phase detector 305, frequency detector 310, combination component 315, and an oscillator 320. In other implementations, PLL 300 may include fewer components, additional components, differently arranged components, or different components.

Phase detector 305 may include one or more devices that receive signals, detect a phase difference between the signals, and output multiple control signals based on the phase difference. As shown in FIG. 3A, phase detector 305 may receive edge clock signal 125 and data edges 130. Phase detector 305 may detect a phase difference between edge clock signal 125 and data edges 130, and output "n" control signals (e.g., proportional control signals 325a-n), based on the detected phase difference (where n is an integer that is greater than 1).

Frequency detector 310 may include one or more devices that receive signals, detect a frequency difference between the signals, and output multiple control signals based on the frequency difference. As shown in FIG. 3A, frequency detector 310 may receive edge clock signal 125 and data edges 130. Frequency detector 310 may detect a phase difference between edge clock signal 125 and data edges 130, and output "n" control signals (e.g., integral control signals 330a-n), based on the detected frequency difference.

Phase detector 305 may detect differences in the phases of edge clock 125 and data edges 130 more frequently than frequency detector 310 detects differences in the frequencies of edge clock 125 and data edges 130. Thus, one or more of proportional control signals 325a-n may change more frequently than one or more of integral control signal 330a-n changes. Furthermore, a difference between the largest value and the smallest value represented by one or more of proportional control signals 325a-n over the period of time may be smaller than a difference between the largest value and the smallest value represented by one or more of integral control signals 330a-n over the period of time.

Combination component 315 may receive proportional control signals 325a-n and integral control signals 330a-n, and generate "n" oscillator control signals 335a-n that are based on proportional control signals 325a-n and integral control signals 330a-n. For example, proportional control signal 325a may represent a value of x, while integral control signal 330a may represent a value of y. In one implementation, oscillator control signal 335a may represent a value of (x+y). In other implementations, oscillator control signal 335a may represent a value that is based on any function of x and y.

In one implementation, oscillator control signals 335a-n may be provided to oscillator 320 as a set of voltage signals. In such an implementation, combination component 315 may include one or more voltage sources that supply the voltage(s) for oscillator control signals 335a-n. Additionally, or alternatively, the voltage(s) for oscillator control signals 335a-n may be supplied from one or more other voltage sources.

Additionally, or alternatively, oscillator control signals 335a-n may be provided to oscillator 320 as a set of current signals. In such an implementation, combination component 315 may include one or more current sources that supply the current(s) for oscillator control signals 335a-n. Additionally, or alternatively, the current(s) for oscillator control signals 335a-n may be supplied from one or more other current sources. By supplying oscillator control signals 335a-n as a set of currents, surface area that is occupied by circuitry (e.g., voltage supply circuitry) may be reduced.

Figure 3B:
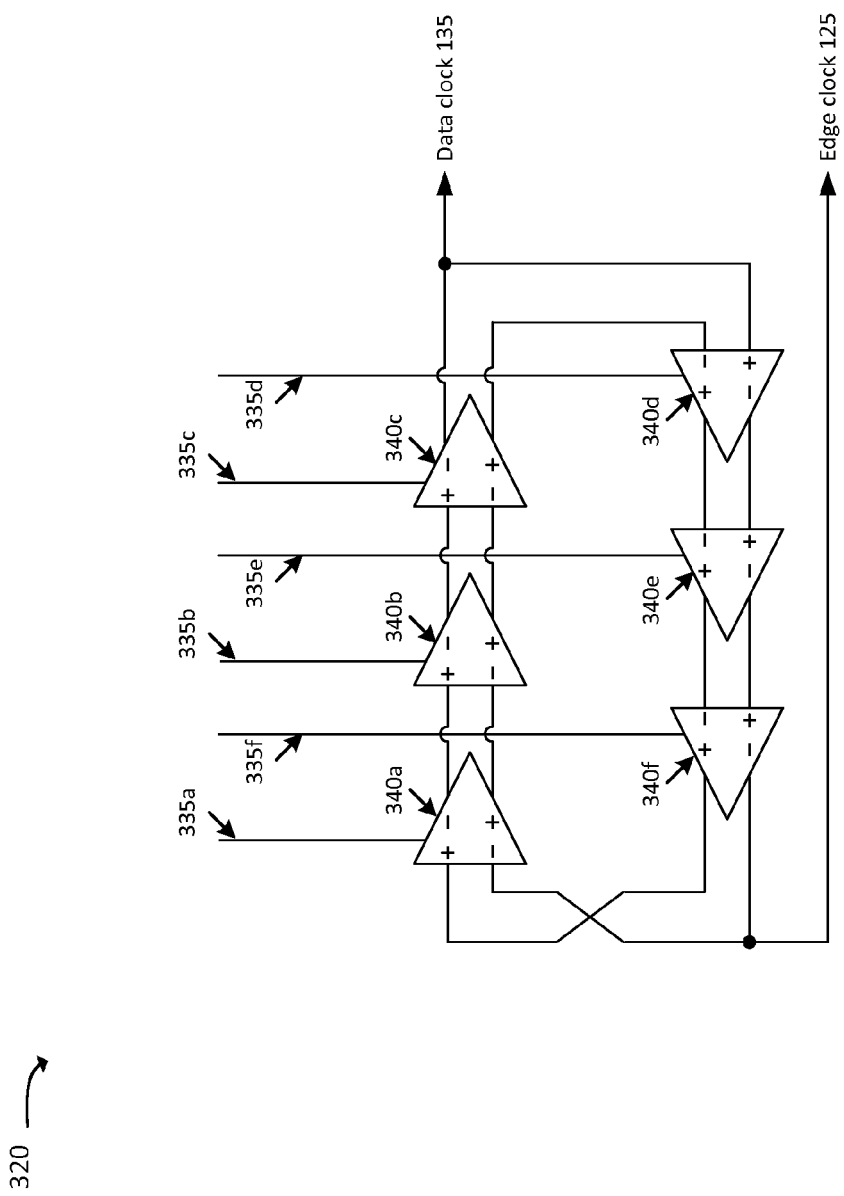
FIG. 3B is a diagram of example components of an oscillator illustrated in FIG. 3A.

Oscillator 320 may receive oscillator control signals 335a-n, and generate edge clock signal 125 and data clock 135 based on oscillator control signals 335a-n. Example components of oscillator 320 are described below with reference to FIG. 3B. As shown in FIG. 3B, oscillator 320 may include a set of buffer stages 340a-f (hereinafter referred to individually as "buffer stage 340," and collectively as "buffer stages 340").

Each buffer stage 340 may include one or more pairs of buffers (e.g., inverters, amplifiers, CML buffers, etc.). Each buffer stage 340 may receive two opposite signals as inputs, and may output two opposite signals as outputs. For example, buffer stage 340a may receive a high-voltage signal (e.g., a logical 1) as a first input, and a low-voltage signal (e.g., a logical 0) as a second input. Buffer stage 340 may output a low-voltage signal (e.g., a logical 0) as a first output, and a high-voltage signal (e.g., a logical 0) as a second output.

A particular output of buffer stage 340c (e.g., an output of one buffer of a pair of buffers in buffer stage 340c) may correspond to data clock signal 135, while a particular output (e.g., an output of one buffer of a pair of buffers in buffer stage 340O of buffer stage 340f may correspond to edge clock signal 125. In the example shown in FIG. 3B, buffer stage 340c may be the third buffer stage out of the six buffer stages 340a-f, while buffer stage 340f may be the sixth buffer stage out of the six buffer stages 340a-f. As such, opposite buffer stages 340 may provide clock signals 125 and 135. In other words, a particular buffer stage 340 may provide one of clock signals 125 and 135, while another buffer stage 340, that is p/2 buffer stages removed from the particular buffer stage 340 (where "p" is the quantity of buffer stages 340 in oscillator 320), may provide the other one of clock signals 125 and 135.

In other implementations, buffer stages 340, which are not opposite buffer stages, may respectively output clock signals 125 and 135. For example, in one other implementation, buffer stage 340c may output data clock signal 135, while buffer stage 340d may output edge clock signal 125.

Each buffer stage 340 may receive a particular oscillator control signal 335 (e.g., a particular one of oscillator control signals 335a-f). In other words, each buffer stage 340 may be independently controlled by an oscillator control signal 335 that corresponds to the buffer stage 340. Adjusting a particular oscillator control signal 335, supplied to a particular buffer stage 340, may adjust a rate at which the particular buffer stage 340 outputs a signal. For example, increasing a particular control signal 335 (e.g., increasing a current, increasing a voltage, etc.) supplied to the particular buffer stage 340 may cause the particular buffer stage 340 to increase a rate at which buffer stage 240 outputs a signal, while lowering the particular control signal 335 (e.g., decreasing a current, decreasing a voltage, etc.) supplied to the particular buffer stage 340 may cause the particular buffer stage 340 to decrease the rate at which buffer stage 340 outputs a signal.

By supplying each buffer stage 340 with its own independent oscillator control signal 335, the rate at which each buffer stage 340 outputs signals may be adjusted. Adjusting the oscillator control signal 335 supplied to a smaller quantity of buffer stages 340 (e.g., adjusting the current and/or voltage supplied to two buffer stages 340) may allow finer adjustment (e.g., phase-adjustment) of clock signals 125 and 135 than they if the oscillator control signal 335 supplied to a larger quantity of buffer stages 340 (e.g., the current and/or voltage supplied to four buffer stages 340, six buffer stages 340, etc.) were adjusted. In other words, adjusting the oscillator control signal 335 supplied to a smaller quantity of buffer stages 340 may allow clock signals 125 and 135 to be adjusted (e.g., phase-adjusted) by a smaller amount than they if the oscillator control signal 335 supplied to a larger quantity of buffer stages 340 were adjusted.

In one implementation, different oscillator control signals 335 may be supplied to each buffer stage 340. Alternatively, or additionally, the same oscillator control signal 335 may be supplied to two or more buffer stages 340. For example, in one implementation, pairs of opposite buffer stages (e.g., buffer stages 340a and 340d; buffer stages 340b and 340e, etc.) may receive the same oscillator control signal 335. Alternatively, or additionally, buffer stages that are not opposite buffer stages (e.g., buffer stages 340a and 340b) may receive the same oscillator control signal 335.

Figure 4A:
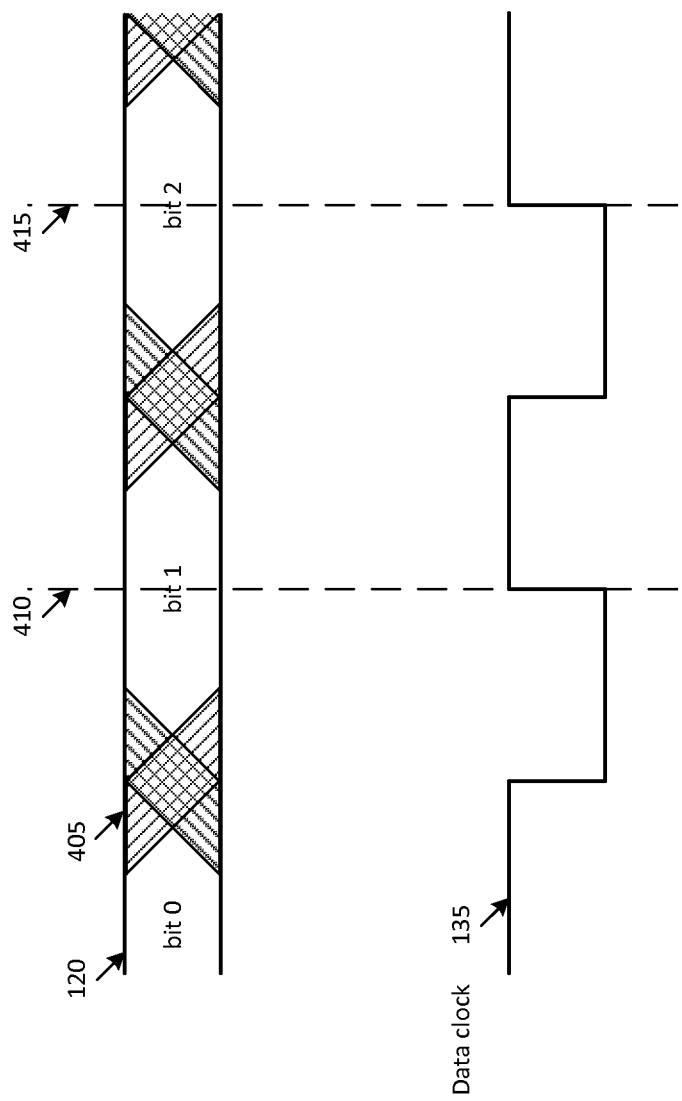
FIG. 4A is a diagram of an example of a desired phase relationship between a data clock and edges of a data stream.

FIG. 4A is a diagram of an example relationship between data clock signal 135 and data stream 120. In the example shown in FIG. 4A, each rising edge (indicated by dashed lines

410 and 415) of data clock signal 135 may indicate a time at which a device (e.g., sampling device 115) should sample data stream 120. In one example, an optimum sampling position of data stream 120 may correspond to a periodic sampling time where data stream 120 exhibits the least likelihood of jitter 405 (or, ideally, a time that exhibits no jitter 405).

Figure 4B:
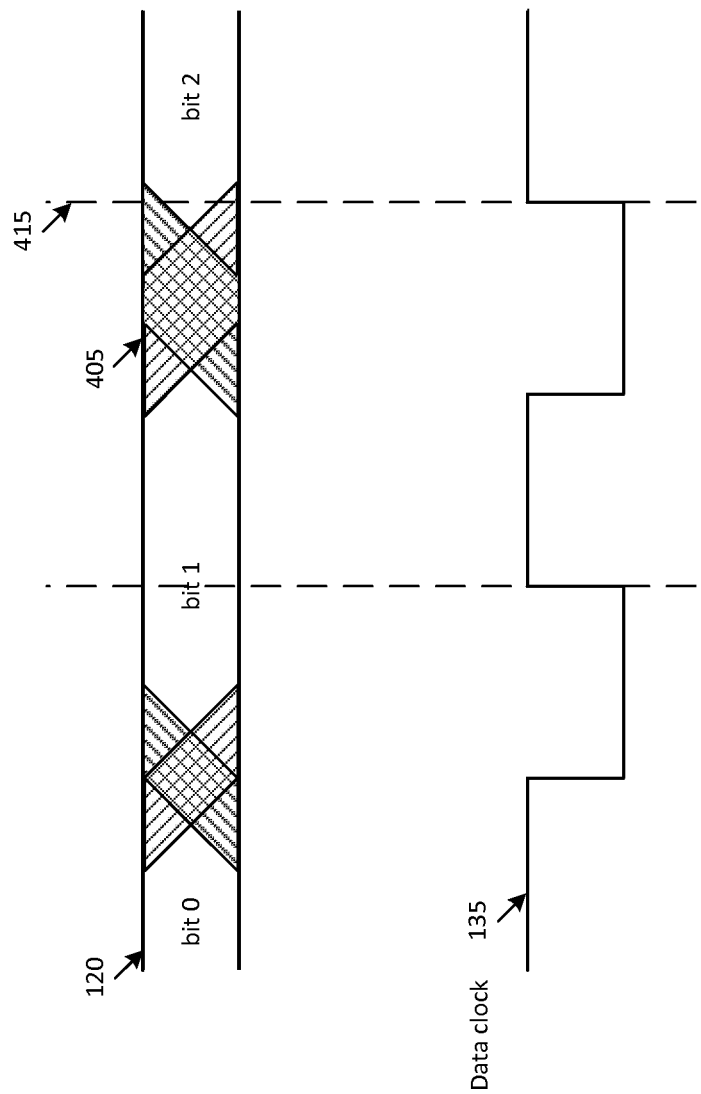
FIG. 4B is a diagram of an example of a data clock being not phase-aligned compared to the edges of the data stream.

FIG. 4B is a diagram of an example of a portion of data clock signal 135 being out of phase compared to data stream 120. Such a situation may occur when data clock signal 135 is not adjusted to account for a change in phase data stream 120. For example, this situation may occur in a system that does not include a PLL for generating a data clock signal based on an edge clock signal that tracks the data edges of an incoming data stream.

Jitter 405 may cause a phase of some or all of data stream 120 to vary. For example, bit 1 may be elongated, and jitter may occur at a time that corresponds to a sampling point (e.g., a time indicated by a rising edge of data clock signal 135 and dashed line 415). This may cause a device (e.g., sampling device 115), which samples data stream 120 based on the rising edges of data clock signal 135, to sample data stream 120 at an undesirable time (e.g., at a time indicated by dashed line 415, which may occur while data stream 120 exhibits jitter 405). As such, bit 2 (and/or other bits) may not be properly sampled. In other words, sampling device 120 may detect a false data value for bit 2, thus raising a bit error rate of sampling data stream 120.

Figure 4C:
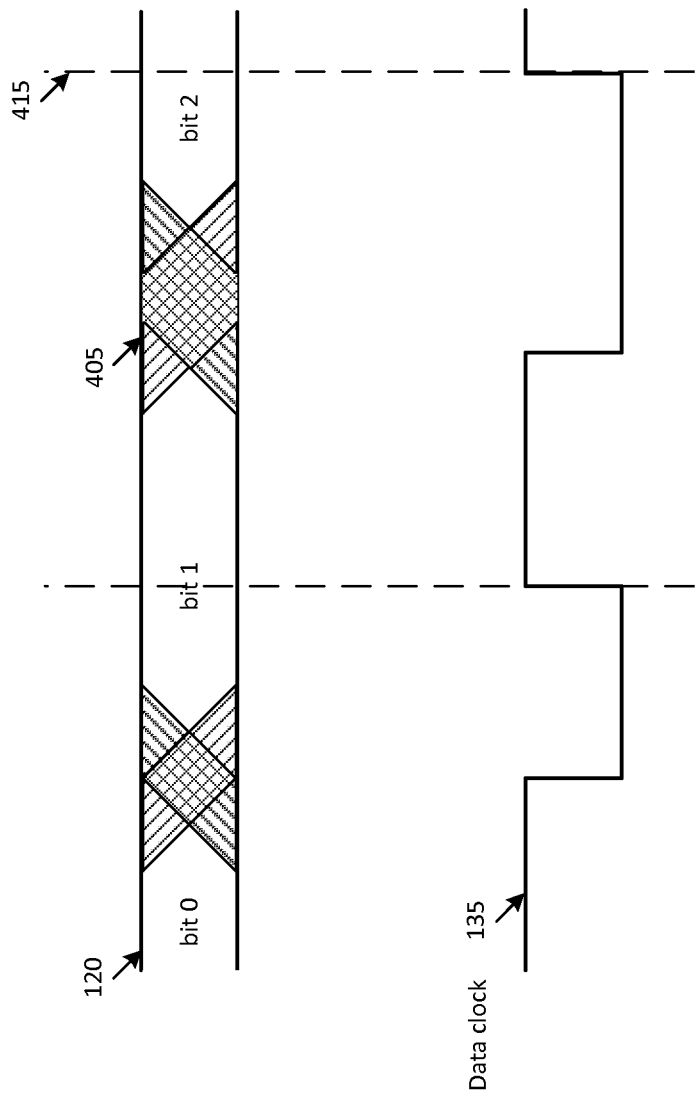
FIG. 4C is a diagram of an example of a data clock after being adjusted based on the edges of the data stream.

FIG. 4C is a diagram of an example of data clock signal 135 accommodating for data stream 120 having a varying phase (e.g., due to jitter 405 or some other cause). In one implementation, data clock signal 135 may be generated by a PLL, such as PLL 110, based on an edge clock signal that tracks the data edges of a data stream.

As shown in FIG. 4C, data stream 120 may experience the same jitter 405 as shown in FIG. 4B. Thus, data stream may vary unpredictably. PLL 110 may generate data clock signal 135 that has the same phase as a data clock that tracks data stream 120. In this manner, sampling points (e.g., rising edges of data clock signal 135) may be adjusted by PLL 110. Because the rising edge of data clock signal 135, associated with dashed line 415, corresponds to a portion of data stream 120 that does not exhibit jitter 405, device 115 may sample bit 2 at an optimal time (thus minimizing bit rate error).

Figure 5:
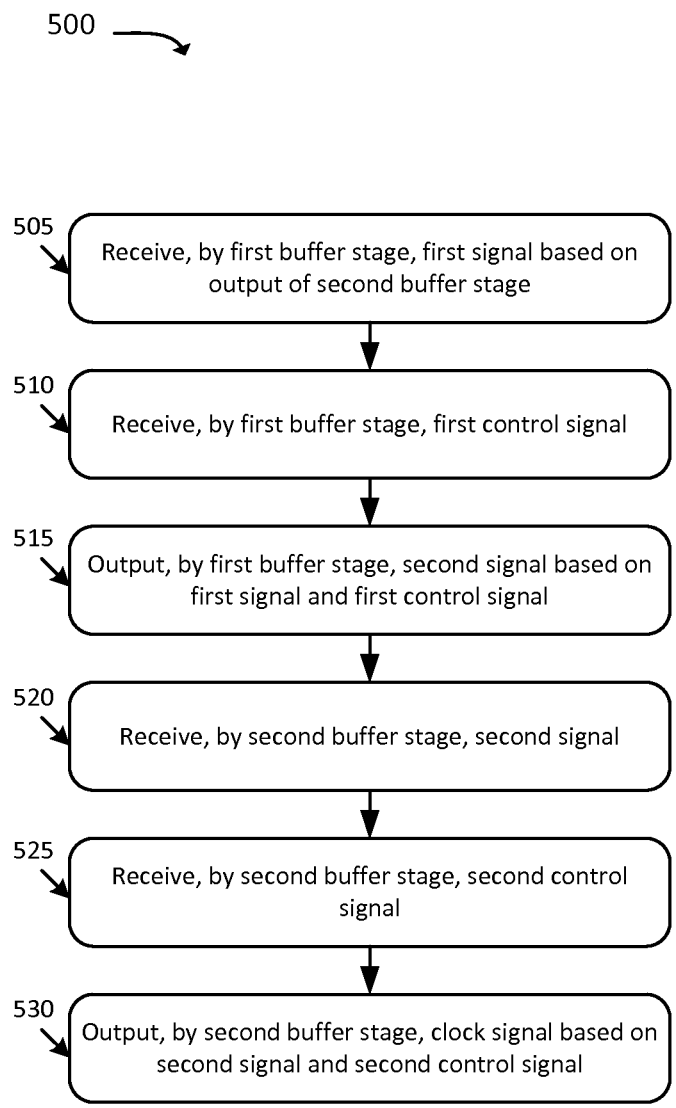
FIG. 5 is a flow chart of an example process for generating a clock signal based on multiple control signals.

FIG. 5 is a flow chart of an example process 500 for generating a clock signal based on multiple control signals. In one implementation, process 500 may be performed by one or more components of PLL 110 (e.g., one or more components of oscillator 330). In other implementations, process 500 may be performed by one or more other components in addition to, or instead of, PLL 110.

Process 500 may include receiving, by a first buffer stage, a first signal based on an output of a second buffer stage (block 505). For example, buffer stage 340*b* may receive a signal that is based on an output of buffer stage 340*c*. In this example, the first signal, received by buffer stage 340*b*, is based on the output of buffer stage 340*c* in that the output of buffer stage 340*c* may pass through one or more other buffer stages 340 before buffer stage 340*b* receives the first signal. In other examples, the first signal may be based on the output of a second buffer stage 340 in that the output of the second buffer stage 340 is provided directly to the first buffer stage 340 (e.g., with no intervening buffer stages 340 between the first buffer stage 340 and the second buffer stage 340).

Process 500 may also include receiving, by the first buffer stage, a first control signal (block 510). For example, buffer stage 340*b* may receive control signal 335*b*. As mentioned above, control signal 335*b* may be based on an output of phase detector 305 and/or frequency detector 310. Process 500 may additionally include outputting, by the first buffer stage, a second signal based on the first signal and the first control signal (block 515). For example, buffer stage 340*b* may output an amplified and/or inverted version of the signal based on the output of buffer stage 340*c*. The output of buffer stage 340*b* may further be based on control signal 335*b* (e.g., a rate of the output of buffer stage 340*b* may be based on a voltage and/or a current supplied by control signal 335*b*).

Process 500 may further include receiving, by the second buffer stage, the second signal (block 520). For example, buffer stage 340*c* may receive the output of buffer stage 340*b*. In this example, buffer stage 340*c* may receive the output directly from buffer stage 340*b*. In other examples, other intervening buffer stages 340 may exist between the first and second buffer stages.

Process 500 may also include receiving, by the second buffer stage, the second control signal (block 525). For example, buffer stage 340*c* may receive control signal 335*c*. Process 500 may additionally include outputting, by the second buffer stage, a clock signal based on the second signal and the second control signal (block 530). For example, buffer stage 340*c* may output data clock 135. Data clock 135 may further be based on control signal 335*c* (e.g., a rate of the output of buffer stage 340*c* may be based on a voltage and/or a current supplied by control signal 335*c*).

The terms "component" and "device," as used herein, are intended to be broadly construed to include hardware (e.g., a processor, a microprocessor, an application-specific integrated circuit ("ASIC"), a field-programmable gate array ("FPGA"), a chip, a memory device (e.g., a read only memory ("ROM"), a random access memory ("RAM"), etc.), etc.) or a combination of hardware and software (e.g., a processor, microprocessor, ASIC, etc., executing software stored by a memory device).

The foregoing description of embodiments provides illustration and description, but is not intended to be exhaustive or to limit the invention to the precise form disclosed. Modifications and variations are possible in light of the above teachings or may be acquired from practice of the invention.

For example, while six buffer stages are illustrated in the example implementations of oscillators 220 and 320 shown in FIGS. 2B and 3B, respectively, other implementations may include different quantities of buffer stages. For example, other implementations of an oscillator may include two, ten, twenty, etc. buffer stages.

In another example, while a series of blocks has been described with regard to FIG. 5, the order of the blocks may be modified in other embodiments. Further, non-dependent blocks may be performed in parallel.

It will be apparent that aspects, as described above, may be implemented in many different forms of software, firmware, and hardware in the embodiments illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein. The software may also include hardware description language ("HDL"), Verilog, Register Transfer Level ("RTL"), Graphic Database System ("GDS") II data or the other software used to describe circuits and arrangement thereof. Such software may be stored in a computer readable media and used to configure a manufacturing process to create physical circuits capable of operating in manners which embody aspects of the present invention.

Further, certain embodiments described herein may be implemented as "logic" that performs one or more functions. This logic may include hardware, such as a processor, an ASIC, or a FPGA, or a combination of hardware and software.

Even though particular combinations of features are recited in the claims and/or disclosed in the specification, these combinations are not intended to limit the invention. In fact, many of these features may be combined in ways not specifically recited in the claims and/or disclosed in the specification. Although each dependent claim listed below may directly depend on only one other claim, the disclosure of the invention includes each dependent claim in combination with every other claim in the claim set.

No element, block, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A device comprising:
   an oscillator to generate a first clock signal based on a first control signal and a second control signal,
      the oscillator comprising:
         a first buffer stage, and
         a second buffer stage,
            the first buffer stage to:
               output a signal that is based on an output of the second buffer stage and the first control signal,
            the second buffer stage to:
               output the first clock signal,
               the first clock signal being based on the first signal, output by the first buffer stage, and the second control signal; and
   one or more components to:
      receive a second clock signal that indicates data edges of a data stream, and
      generate the first control signal and the second control signal based on the second clock signal.

2. The device of claim 1, where a phase associated with the first clock signal is a same phase as a phase associated with the second clock signal.

3. The device of claim 1, where each of the first buffer stage and the second buffer stage includes at least one pair of buffers.

4. The device of claim 1, where each of the first buffer stage and the second buffer stage includes at least one pair of inverters.

5. The device of claim 1, where the signal output by the first buffer stage corresponds to a first signal,
   where the oscillator further includes:
      a third buffer stage to:
         receive a third control signal that is a same signal as one of the first control signal or the second control signal,
         receive a second signal that is based on an output of the second buffer stage, and
         output a third signal based on the third control signal and the second signal.

6. The device of claim 1, where a phase associated with the first clock signal is not a complement of a phase associated with the output of the second buffer stage.

7. The device of claim 1, where a phase associated with the first clock signal is a complement of a phase associated with the output of the second buffer stage.

8. The device of claim 1, where the first control signal and the second control signal are supplied by a first current source and a second current source, respectively.

9. The device of claim 1, where the first control signal and the second control signal are supplied by a first voltage source and a second voltage source, respectively.

10. The device of claim 1, where each rising edge of the first clock signal indicates a time at which the data stream is to be sampled.

11. A system comprising:
   a clock generation component to generate a first clock signal based on a first control signal and a second control signal,
      the clock generation component comprising:
         a first buffer stage, and
         a second buffer stage,
            the first buffer stage to:
               output a signal that is based on an output of the second buffer stage and the first control signal,
            the second buffer stage to:
               output the first clock signal,
               the first clock signal being based on the signal, output by the first buffer stage, and the second control signal; and
   one or more detector components to:
      generate the first control signal and the second control signal based on a second clock signal that indicates data edges of a data stream.

12. The system of claim 11, where the signal output by the first buffer stage corresponds to a first signal, and
   where the clock generation component further includes:
      a third buffer stage to output a second signal based on:
         a third control signal that is a same signal as one of the first control signal or the second control signal, and
         a third signal that is based on the output of the second buffer stage.

13. The system of claim 11, where a phase associated with the first clock signal is not a complement of a phase associated with the output of the second buffer stage.

14. The system of claim 11, where a phase associated with the first clock signal is a complement of a phase associated with the output of the second buffer stage.

15. The system of claim 11, where the one or more detector components include one or more current sources that supply the first control signal and the second control signal.

16. The system of claim 11, where the one or more detector components include one or more voltage sources that supply the first control signal and the second control signal.

17. The system of claim 11, where a phase associated with the first clock signal is a same phase as a phase associated with the second clock signal, and
   where each rising edge of the first clock signal indicates a time at which the data stream is to be sampled.

18. A method, comprising:
   outputting, by a first buffer stage of an oscillator device, a signal that is based on an output of a second buffer stage of the oscillator device and a first control signal;
   receiving, by the second buffer stage, the signal output by the first buffer stage; and
   outputting, by the second buffer stage, a first clock signal that is based on:
      the signal output by the first buffer stage, and
      a second control signal that is different from the first control signal,
         the first control signal and the second control signal being generated based on a second clock signal that indicates data edges of a data stream, the first clock signal indicating a time at which the data stream is to be sampled.

19. The method of claim 18, further comprising:
receiving, by a detector component associated with the oscillator device, the second clock signal; and
generating, by the detector component, the first control signal and the second control signal based on the second clock signal.

20. The method of claim 18, where the signal output by the first buffer signal corresponds to a first signal,
the method further comprising:
receiving, by a third buffer stage of the oscillator device, a third control signal that is a same signal as one of the first control signal or the second control signal,
receiving, by the third buffer stage, a second signal that is based on the output of the second buffer stage, and
outputting, by the third buffer stage, a third signal based on the third control signal and the second signal.

* * * * *